United States Patent [19]

Sommargren

[11] Patent Number: 5,133,599
[45] Date of Patent: Jul. 28, 1992

[54] HIGH ACCURACY LINEAR DISPLACEMENT INTERFEROMETER WITH PROBE

[75] Inventor: Gary E. Sommargren, Santa Cruz, Calif.

[73] Assignee: Zygo Corporation, Middlefield, Conn.

[21] Appl. No.: 636,750

[22] Filed: Jan. 2, 1991

[51] Int. Cl.[5] .............................................. G01B 9/02
[52] U.S. Cl. ..................................... 356/349; 356/358
[58] Field of Search ...................... 356/349, 351, 358

[56] References Cited

U.S. PATENT DOCUMENTS

| 4,334,778 | 6/1982 | Pardue et al. | 356/351 |
| 4,577,968 | 3/1986 | Makosch | 356/351 |
| 4,950,078 | 8/1990 | Sommargren | 356/351 |

*Primary Examiner*—Vincent P. McGraw
*Assistant Examiner*—Richard Kurtz, II
*Attorney, Agent, or Firm*—Bryan, Cave, McPheeters & McRoberts

[57] ABSTRACT

A high accuracy linear displacement interferometer capable of measuring changes in displacement of two plane mirror surfaces (60, 61) comprises a source (10) of an input beam (12) with two linear orthogonally polarized components which may or may not be of the same optical frequency, a birefringent optical element (40) and a quarter-wave phase retardation plate (42) for converting the input beam (12) into two separated, parallel, oppositely handed circularly polarized beams (16, 17); a first plane mirror (60) comprising one of the two (60, 61) plane mirror surfaces; a second plane mirror (61) nominally parallel to and rigidly connected to the first plane mirror (60) surface comprising the other of the two plane mirror surfaces; the birefringent optical element (40), the quarter-wave phase retardation plate (42), a right angle prism (48) with reflective, orthogonal faces, and a pair of retroreflectors (44, 45) causing each of the separated, parallel, oppositely handed circularly polarized output beams (32, 33); the quarter-wave phase retardation plate (42) and the birefringent optical element (44) converting the two separated, parallel, oppositely handed circularly polarized output beams (32, 33) into a single output beam (52) in which the phase difference between the two orthogonally polarized components of the single output beam (52) is directly proportional to the linear displacement of the two plane mirrors (60, 61); a polarizer (70) for mixing the orthogonal components of the single output beam (52); a photoelectric detector (83), for producing an electrical measurement signal; means to extract the phase difference from the electrical measurement signal (85), the extracted phase difference being proportional to the optical path length changes between the two plane mirrors (60, 61); and a probe (62) mounted symmetrically in the right angle prism (48).

27 Claims, 4 Drawing Sheets

DIRECTION OF MOTION OF TRANSLATION STAGE (64)

HIGH ACCURACY LINEAR DISPLACEMENT INTERFEROMETER WITH PROBE

BACKGROUND OF THE INVENTION

1. Field of the Invention

The present invention relates to apparatus for the measurement of linear displacements. More particularly, the invention relates to optical apparatus which is useful for high accuracy linear displacement metrology using interferometry.

2. The Prior Art

An interferometer is a basic instrument for most high accuracy displacement measurements in dilatometry, material stability studies, the machine tool industry, and in the semiconductor fabrication industry. One type of interferometer representative of the current state-of-the-art is the differential plane mirror interferometer which measures the optical path length changes between two external mirrors and which is described in R. R. Baldwin and G. J. Siddall, "A double pass attachment for the linear and plane interferometer," Proc. SPIE, Vol. 180, pp. 78-83 (May 1984) and in commonly-owned U.S. Pat. Nos. 4,693,605 and 4,752,133 issued Sep. 15, 1987 and Jun. 21, 1988, respectively.

A limit on the accuracy of a heterodyne interferometer is the periodic, i.e. cyclic, error caused by leakage of the frequency components in the beamsplitter, see for example, N. Bobroff, "Residual Errors in Laser Interferometry from Air Turbulence and Non Linearity," Applied Optics, Vol. 26, pp. 266-2682 (July 1987) and C. M. Sutton, "Non-Linearity in Length Measurement Using Heterodyne Laser Michelson Interferometry," J. Phys. E: Sci. Instrum. Vol. 20, pp. 1290-1292 (1987).

For differential plane mirror interferometers of the prior art, the magnitude of this cyclic error ranges from ±1 to ±10 nanometers.

While commonly-owned U.S. Pat. No. 4,950,078 issued Aug. 21, 1990 discloses a high accuracy differential plane mirror interferometer, it does not solve all of the problems which are solved by the present invention which has improved utility for the high accuracy measurement of linear displacement of stages used with probes.

SUMMARY OF THE INVENTION

In accordance with the instant invention, I provide a high accuracy linear displacement interferometer capable of measuring changes in displacement of two plane mirror surfaces comprising: a source of an input beam with two linear orthogonally polarized components which may or may not be of the same optical frequency, means, most preferably a birefringement optical element and a quarter-wave phase retardation plate for converting the input beam into two separated, parallel, oppositely handed circularly polarized beams; a first plane mirror comprising one of the two plane mirror surfaces; a second plane mirror nominally parallel to and rigidly connected to the first plane mirror surface comprising the other of the two plane mirror surfaces; means, most preferably the previously mentioned birefringent optical element and quarter-wave phase retardation plate as well as a right angle prism with reflective, orthogonal faces, and a pair of retroreflectors for causing each of the separated, parallel, oppositely handed circularly polarized beams to be reflected twice by each of two plane mirrors, respectively, to produce two separated, parallel, oppositely handed circularly polarized output beams; means, most preferably the previously mentioned quarter-wave phase retardation plate and the birefringent optical element, for converting the two separated, parallel, oppositely handed circularly polarized output beams into a single output beam in which the phase difference between the two orthogonally polarization components of the single output beam is directly proportional to the linear displacement of the plane mirrors; means, most preferably a photoelectric detector, for producing an electrical measurement signal; means to extract the phase difference from the electrical measurement signal, the extracted phase difference being proportional to the optical path length changes between the two plane mirrors; and means, most preferably a probe, mounted symmetrically in the right angle prism.

THE DRAWINGS

In the drawings,

FIGS. 1a, 1b, 1c, taken together, illustrate, in schematic form, a preferred embodiment of the present invention, with FIGS. 1a, 1b, and 1c, respectively, showing the beams in different planes, with FIG. 1b being a plan view of the apparatus of FIG. 1a and with FIG. 1c being a side view, similar to FIG. 1a, except being in a plane parallel to, but offset from that of FIG. 1a; and FIG. 2 illustrates in schematic form the same embodiment as shown in FIGS. 1a-1c in perspective view.

DETAILED DESCRIPTION OF THE INVENTION

Figure 1A:
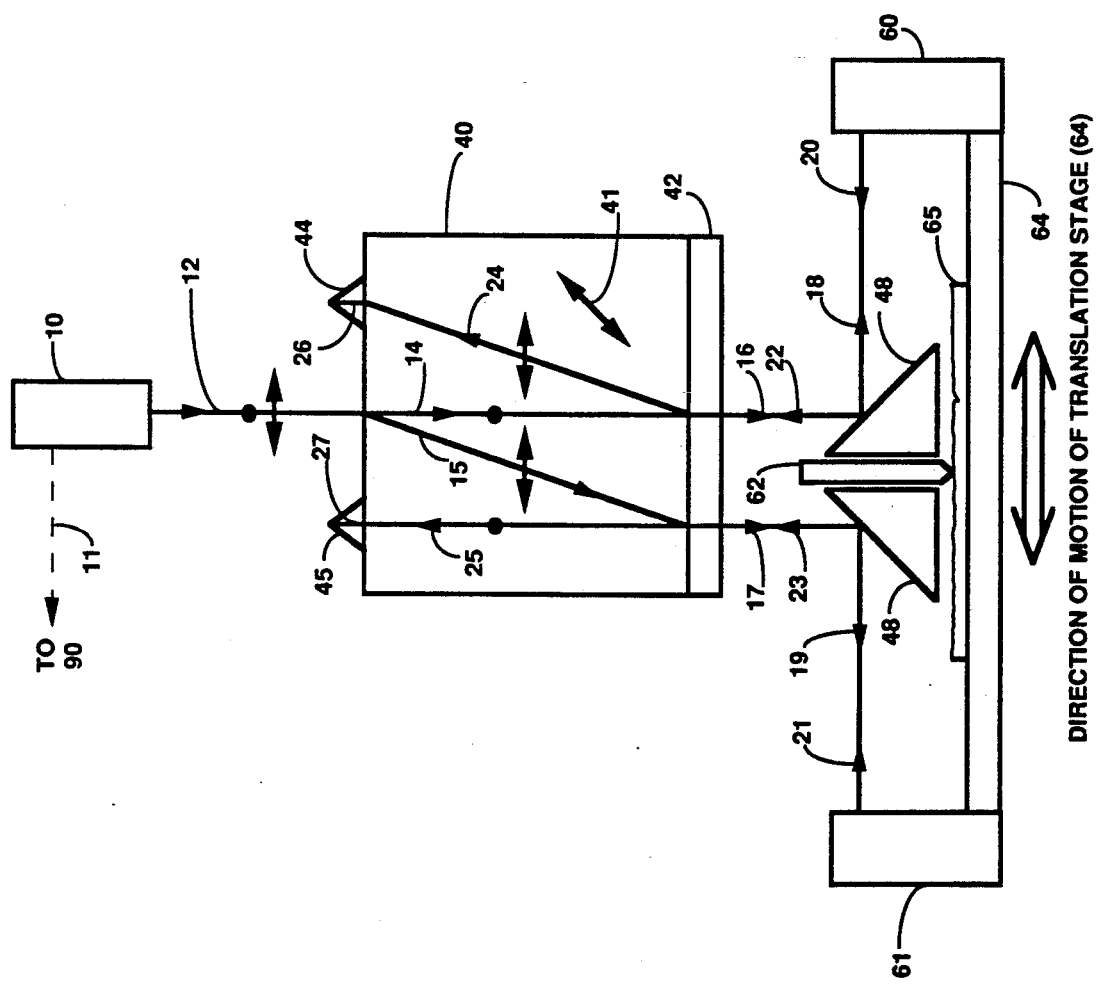
Figure 1B:
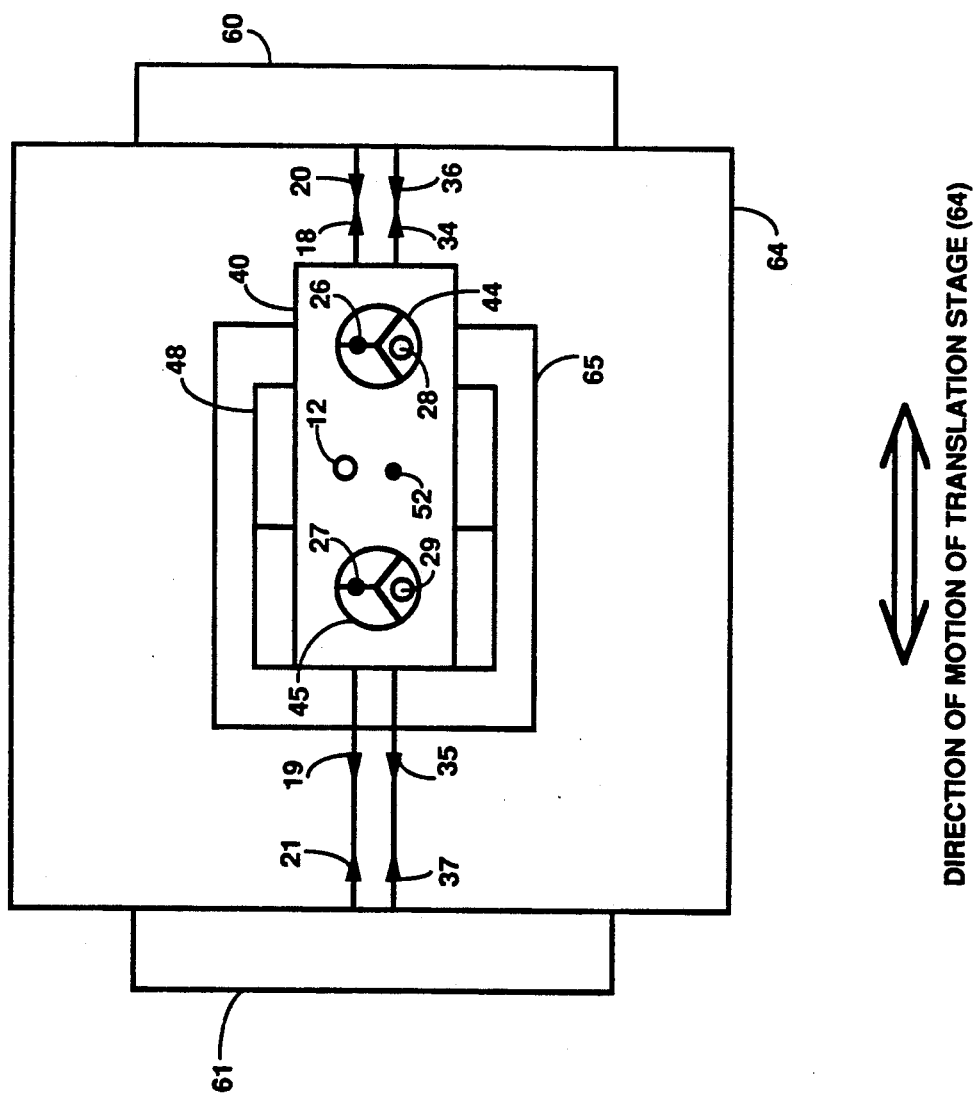
Figure 1C:
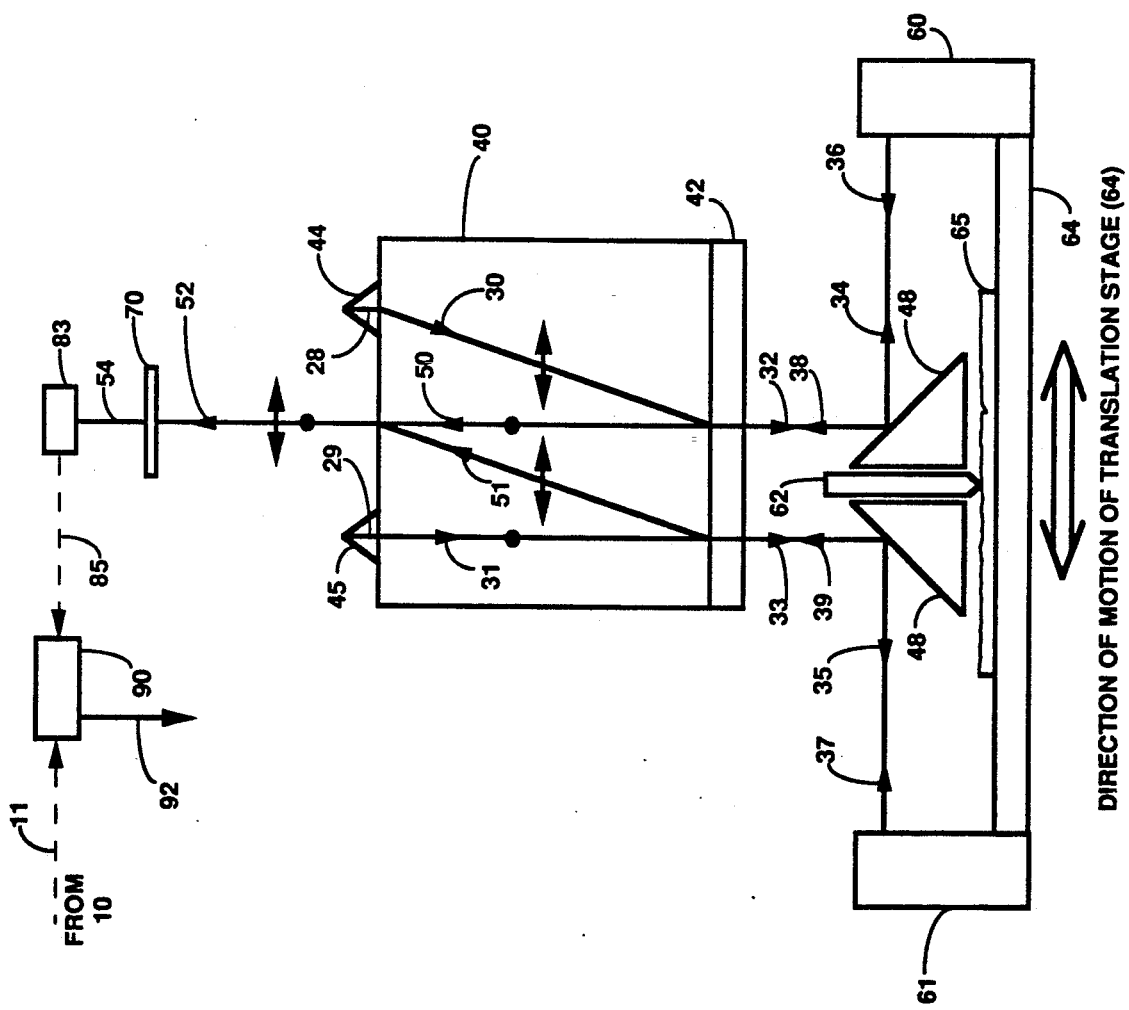

Referring now to the drawings in detail, FIGS. 1a-1c illustrate, in schematic form, a preferred embodiment of the present invention. Since the optical beams lie in different planes, three FIGS. 1(a), 1(b), and 1(c), are used to illustrate the different planes for the presently preferred high accuracy linear displacement interferometer of the present invention. While the present invention has application for a wide range of radiation sources, the following description is taken, by way of example, with respect to an optical measuring system employing a laser (10) for providing the presently preferred high accuracy linear displacement interferometer.

In FIG. 1(a), light source (10), which most preferably uses a frequency stabilized laser, emits input beam (12) which is comprised of two linear orthogonally polarized components as indicated by the dot and arrow, which may or may not be of the same optical frequency. If the frequencies are the same, see for example, Downs, et al., U.S. Pat. No. 4,360,271, issued Nov. 23, 1982. If the frequencies are different, see for example, Bagley, et al., U.S. Pat. No. 3,458,259, issued Jul. 26, 1969 and commonly owned U.S Pat. No. 4,688,940 issued Aug. 25, 1987, in which source (10) would provide an electrical reference signal (11), shown by the dotted lines, which would correspond to the frequency difference between the two stabilized frequencies. No such reference signal (11) is provided when the two orthogonally polarized components comprising the input beam (12) are of the same frequency.

As shown and preferred, input beam (12) is incident on a birefringent crystal (40) (e.g. quartz or calcite) having an optical axis (41). The component of polarization perpendicular to the figure (indicated by the dot) is transmitted directly as beam (14) whereas the component of polarization parallel to the figure (indicated by the arrow) is transmitted at a slight angle as beam (15). Beams (14) and (15) pass through a quarter-wave phase retardation plate (42) and are converted into circularly polarized beams (16) and (17), respectively. The resultant circularly polarized beams (16) and (17) are parallel and sufficiently separated to be incident on the opposite faces of a right angle prism (48) which is fixed relative to the birefringement crystal (40) and quarter-wave phase retardation plate (42) and is de-coupled from a translation stage (64) forming part of the interferometer system. Beams (16) and (17) are reflected from the respective reflective, orthogonal faces of the right angle prism (48) as beams (18) and (19) which are collinear but traveling in opposite directions. As shown and preferred, an integral part of the right angle prism (48) is a probe (62) which may be a conventional optical, capacitance, tunneling, atomic force, thermal or related type of probe. The probe (62) preferably measures some specific property of a sample (65) as the translation stage (64) is moved in the direction indicated in FIG. 1(a). Beams (18) and (19) are incident on a pair of plane mirrors (60) and (61), respectively, which are rigidly attached to the translation stage (64) whose position, and consequently the position of the probe (62) on the sample (65), is being measured by the present invention. Beams (18) and (19) are reflected by the plane mirrors (60) and (61) as beams (20) and (21), respectively. Beams (20) and (21) are, in turn, reflected from the faces of the right angle prism (48) as beams (22) and (23) and pass through the quarter-wave phase retardation plate (42) as beams (24) and (25), their polarizations now being orthogonally polarized to beams (14) and (15), respectively. Beam (24) is transmitted through the birefringent crystal (40) at a slight angle while beam (25) is directly transmitted through the birefringent crystal (40). As further shown and preferred, beam (24) enters retroreflector (44) as beam (26) and beam (25) enters retroreflector (45) as beam (27).

Referring now to FIG. 1(b), this illustrates the beams in a plane looking down on the apparatus of FIG. 1(a) in a plan view. As can be seen in this view, beam (26) is reflected from retroreflector (44) so that it is parallel to and offset from beam (26) as beam (28). Likewise, beam (27) is reflected from retroreflector (45) so that it is parallel to and offset from beam (27) as beam (29).

Referring now to FIG. 1(c), this illustrates the beams in a plane which shows a side view of the apparatus of FIG. 1(a), similar to FIG. 1(a) except in a plane parallel to, but offset from that of FIG. 1(a). While FIG. 1(a) shows the plane containing beams (26) and (27), FIG. 1(c) shows the offset plane containing beams (28) and (29). Beam (28) is incident on the birefringement crystal (40) and is transmitted at a slight angle as beam (30). Beam (29) is incident on the birefringement crystal (40) and is directly transmitted as beam (31). Beams (30) and (31), in turn, pass through quarter-wave phase retardation plane (42) and are converted into circularly polarized beams (32) and (33), respectively. Beams (32) and (33) are sufficiently separated to be incident on the opposite faces of the right angle prism (48) and are reflected from the respective faces of the right angle prism (48) as beams (34) and (35). Beams (34) and (35) are reflected from the respective plane mirrors (60) and (61) as beams (36) and (37). Beams (36) and (37) are then reflected from the faces of the right angle prism (48) as beams (38) and (39). As shown, beams (38) and (39) are parallel due to the properties of the retroreflectors (44) and (45) and the double reflections from plane mirrors (60) and (61), even though the plane mirrors (60) and (61) may not be precisely parallel to each other. Beams (38) and (39) pass through the quarter-wave phase retardation plate (42) as beams (50) and (51). Their polarizations are now identical to beams (14) and (15), respectively. Beam (50) is directly transmitted through the birefringent crystal (40) while beam (51) is transmitted through the birefringent crystal (40) at a slight angle. Beams (50) and (51) are then recombined as output beam (52) as they leave the birefringent crystal (40).

Output beam (52), like input beam (12), has two orthogonally polarized components. Each component has traversed exactly the same optical path length (through air, glass, and crystal) except for the optical path between the right angle prism (48) and the mirrors (60) and (61) attached to the translation stage (64). This optical path length results in a phase difference between the two polarization components of output beam (52). Motion of translation stage (64), along the direction indicated by the arrow, causes this phase difference to vary. This phase variation is directly proportional to the distance moved by the translation stage (64) and is measured by passing output beam (52) through polarizer (70), oriented at 45° to each polarization component, which mixes the two orthogonally polarized components in output beam (52) to give beam (54).

The interference between the two polarization components is then detected by a photodetector (83), thereby producing an electrical signal (85). Electronic module (90) extracts the phase variation from this electric signal (85). When the two polarization components of beam (12) are of the same optical frequency, module (90) does not require reference signal (11) and conventionally extracts the phase variation from signal (85) such as in the manner described in U.S. Pat. No. 4,360,271. However, when the two polarization components of input beam (12) are of different optical frequencies, module (90) requires reference signal (11) and extracts the phase variation from signal (85) such as in the manner described in U.S. Pat. No. 4,688,940. In either event, electronic module (90) provides an output (92) which is directly proportional to the change in position of the translation stage (64), and thus the test sample (65), relative to the probe (62).

Figure 2:
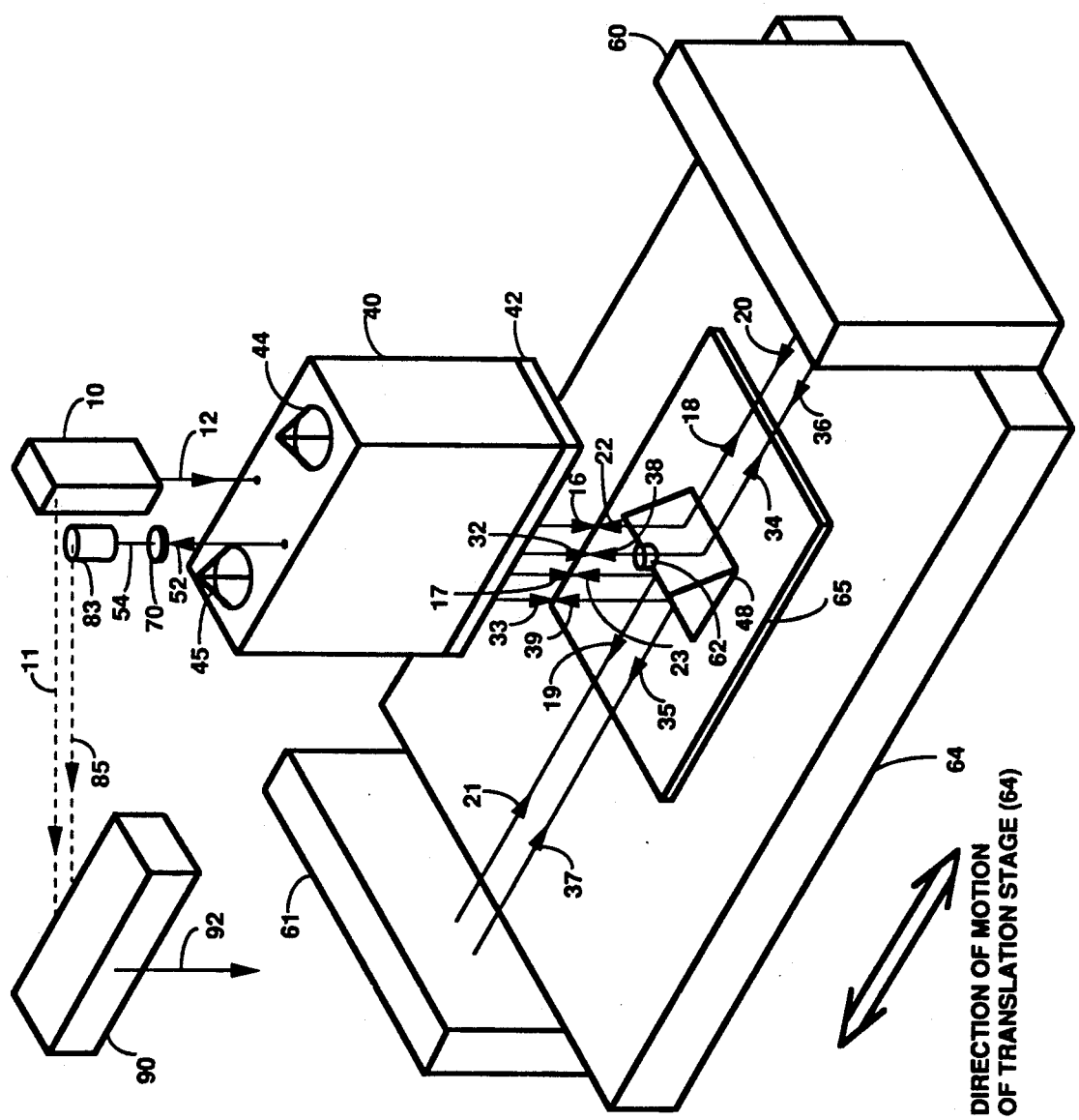

FIG. 2 is a perspective view of the same embodiment previously described in detail with reference to FIGS. 1(a), (b) and 1(c). Thus, the components, beams and functions are identical to those previously described with reference to FIGS. 1(a), 1(b) and 1(c) and will not be described further.

Suffice it to say, that the system of the present invention is advantageous over the prior art such as with respect to: (1) significantly reduced cyclic errors, (2) reduced environmental errors by the use of symmetry, (3) increased stability by integrating the probe with the interferometer, and (4) compact translation stage by configuring the interferometer above stage.

While a preferred embodiment of the invention has been disclosed, obvious modifications and extension to two-dimensions can be made therein, without departing from the scope of the invention as defined in the following claims.

What is claimed is:

1. A high accuracy linear displacement interferometer comprising a source of an input beam, aid input beam comprising two linear orthogonally polarized components; means optically aligned with said input beam for converting said input beam into two separated, parallel, oppositely handed circularly polarized beams; a translation stage; a first plane mirror comprising a first plane mirror surface mounted on said translation stage; a second plane mirror comprising a second plane mirror surface mounted on said translation stage, said second plane mirror surface being nominally parallel to and rigidly connected to said first plane mirror surface on said translation stage, said interferometer being capable of measuring changes in displacement of said first and second plane mirror surfaces; means optically aligned with said separated, parallel, oppositely handed circularly polarized beams and said first and second plane mirror surfaces for causing each of said separated, parallel, oppositely handed circularly polarized beams to be reflected twice by each of said first and second plane mirrors, respectively, for producing two separated, parallel, oppositely handed circularly polarized output beams, said means comprising right angle prism means having reflective orthogonal faces optically aligned with said first and second plane mirror surfaces and said separated, parallel, oppositely handed circularly polarized beams, and retroreflector means, said right angle prism means being decoupled from said translation stage, said retroflector means comprising a retroflective surface means optically associated with each of said separated, parallel, oppositely handed circularly polarized beams, said input beam converting means being optically aligned with said retroreflector means and further comprising means for converting said two separated, parallel, oppositely handed circularly polarized output beams into a single output beam comprising two orthogonally polarized components having a phase difference therebetween which is directly proportional to linear displacement of said two plane mirrors; means for determining said phase difference between said two orthogonally polarized components of said single output beam, said determined phase difference being proportional to any optical path length changes between said two plane mirrors; and probe means mounted symmetrically in said right angle prism means for measuring a specific property of a test sample disposed on said translation stage as said displacement of said first and second plane mirror surfaces changes, said changes in displacement providing changes in said optical path length between said two plane mirrors; whereby said optical path length changes correspond to the position of said probe on said test sample.

2. An interferometer in accordance with claim 1 wherein said means for determining said phase difference comprises means for mixing said orthogonally polarized components of said single output beam and for producing an electrical measurement signal therefrom.

3. An interferometer in accordance with claim 2 wherein said means for determining said phase difference further comprises means operatively connected to said means for producing said electrical measurement signal for extracting said phase difference from said electrical measurement signal, said extracted phase difference being proportional to said optical path length changes between said two mirrors.

4. An interferometer in accordance with claim 3 wherein said means for producing said electrical measurement signal comprises photoelectric detector means.

5. An interferometer in accordance with claim 4 wherein said mixing means comprises polarizer means.

6. An interferometer in accordance with claim 2 wherein said mixing means comprises polarizer means.

7. An interferometer in accordance with claim 1 wherein said input beam source comprises frequency stabilized laser means.

8. An interferometer in accordance with claim 7 wherein said input beam orthogonally polarized components are of the same optical frequency.

9. An interferometer in accordance with claim 7 wherein said input beam orthogonally polarized components are of different optical frequencies.

10. An interferometer in accordance with claim 1 wherein said input beam converting means comprises birefringent optical means.

11. An interferometer in accordance with claim 10 wherein said birefringent optical means comprises a birefringent crystal.

12. An interferometer in accordance with claim 11 wherein said birefringent crystal comprises quartz.

13. An interferometer in accordance with claim 11 wherein said birefringent crystal comprises calcite.

14. An interferometer in accordance with claim 10 wherein said input beam converting means further comprises quarter-wave phase retardation plate means.

15. An interferometer in accordance with claim 14 wherein said birefringent optical means comprises a birefringent crystal.

16. An interferometer in accordance with claim 1 wherein said means for producing said two separated, parallel, oppositely handed circularly polarized output beams further comprises birefringent optical means.

17. An interferometer in accordance with claim 16 wherein said birefringent optical means comprises a birefringent crystal.

18. An interferometer in accordance with claim 16 wherein said means for producing said two separated, parallel, oppositely handed circularly polarized output beams further comprises quarter-wave phase retardation plate means.

19. An interferometer in accordance with claim 18 wherein said birefringent optical means comprises a birefringent crystal.

20. An interferometer in accordance with claim 16 wherein said input beam converting means comprises said birefringent optical means.

21. An interferometer in accordance with claim 20 wherein said birefringent optical means comprises a birefringent crystal.

22. An interferometer in accordance with claim 20 wherein said means for producing said two separated, parallel, oppositely handed circularly polarized output beams further comprises quarter-wave phase retardation plate means, said input beam converting means further comprising said quarter-wave phase retardation plate means.

23. An interferometer in accordance with claim 22 wherein said birefringent optical means comprises a birefringent crystal.

24. An interferometer in accordance with claim 1 wherein said retroreflective surface means each comprise a retroreflector, said retroreflector means comprising a pair of said retroreflectors separated from each other for enabling each of said retroreflectors of said pair to be optically aligned with a different one of said separated, parallel, oppositely handed circularly polarized beams.

25. An interferometer in accordance with claim 24 wherein said input beam converting means comprises birefringent optical means.

26. An interferometer in accordance with claim 25 wherein said birefringent optical means comprises a birefringent crystal.

27. An interferometer in accordance with claim 25 wherein said means for producing said two separated, parallel, oppositely handed circularly polarized output beams further comprises said birefringent optical means.

* * * * *

UNITED STATES PATENT AND TRADEMARK OFFICE
CERTIFICATE OF CORRECTION

PATENT NO. : 5,133,599

DATED     : July 28, 1992

INVENTOR(S): GARY E. SOMMARGREN et al.

It is certified that error appears in the above-identified patent and that said Letters Patent is hereby corrected as shown below:

Column 4, line 47:   Change "(b)" to --1(b)--.

Column 4, line 65:   Change "aid" to --said--.

Signed and Sealed this

Thirty-first Day of August, 1993

Attest:

BRUCE LEHMAN

Attesting Officer    Commissioner of Patents and Trademarks